(12) United States Patent
Chiba

(10) Patent No.: US 9,551,729 B2
(45) Date of Patent: Jan. 24, 2017

(54) PACKAGE, ELECTRONIC DEVICE, METHOD OF MANUFACTURING ELECTRONIC DEVICE, ELECTRONIC APPARATUS, AND MOVING OBJECT

(71) Applicant: Seiko Epson Corporation, Tokyo (JP)

(72) Inventor: Seiichi Chiba, Minowa-machi (JP)

(73) Assignee: Seiko Epson Corporation (JP)

( * ) Notice: Subject to any disclaimer, the term of this patent is extended or adjusted under 35 U.S.C. 154(b) by 376 days.

(21) Appl. No.: 14/223,086

(22) Filed: Mar. 24, 2014

(65) Prior Publication Data
US 2014/0291010 A1  Oct. 2, 2014

(30) Foreign Application Priority Data
Mar. 29, 2013 (JP) ................ 2013-071569

(51) Int. Cl.
| | |
|---|---|
| H05K 5/02 | (2006.01) |
| G01P 15/09 | (2006.01) |
| G01P 1/02 | (2006.01) |
| G01P 15/08 | (2006.01) |
| H03H 9/10 | (2006.01) |

(52) U.S. Cl.
CPC ............. *G01P 15/09* (2013.01); *G01P 1/023* (2013.01); *G01P 15/0802* (2013.01); *H03H 9/1021* (2013.01); *Y10T 29/49002* (2015.01)

(58) Field of Classification Search
CPC .......... H05K 5/00; H05K 5/0095; H05K 5/02; H05K 5/0026; H05K 5/0047; H01L 23/02; H01L 24/07; H01L 23/10; G01P 15/09; G01P 1/02; G01P 15/0802; G01P 1/023; H03H 9/1021; Y10T 29/49002

USPC ............. 174/520, 255, 250, 521, 256, 260; 257/678, 684, 687, 691, 698, 701, 704, 257/729; 29/592.1; 220/200

See application file for complete search history.

(56) References Cited

U.S. PATENT DOCUMENTS

| | | | | |
|---|---|---|---|---|
| 7,595,540 B2 * | 9/2009 | Fukuda | ................... | H01L 24/97 257/704 |
| 7,859,070 B2 * | 12/2010 | Kuboi | ..................... | H01L 23/10 257/431 |
| 7,948,069 B2 * | 5/2011 | Zhuang | ................... | H01L 23/10 257/678 |
| 8,796,558 B2 * | 8/2014 | Iizuka | ............... | H01L 23/49805 174/250 |
| 8,884,165 B2 * | 11/2014 | Kamada | .................. | H01L 24/97 174/255 |
| 8,975,517 B2 * | 3/2015 | Kohda | .................... | H01L 23/10 174/521 |

(Continued)

FOREIGN PATENT DOCUMENTS

| | | |
|---|---|---|
| JP | 11-204671 A | 7/1999 |
| JP | 2000-277647 A | 10/2000 |
| JP | 2005-142329 A | 6/2005 |

*Primary Examiner* — Angel R Estrada
(74) *Attorney, Agent, or Firm* — Harness, Dickey & Pierce, P.L.C.

(57) ABSTRACT

A package includes a base portion, and a lid which is placed on the base portion to define an inner space with the base portion and has a metal plate layer and a brazing material layer that is laminated on the metal plate layer, in which the base portion has a metalized layer which is joined with the brazing material layer around the inner space in a plane view, and the brazing material layer has a protrusion which protrudes in a opposite direction of the base portion on an outer peripheral side surface of the metal plate layer.

3 Claims, 5 Drawing Sheets

(56) References Cited

U.S. PATENT DOCUMENTS 9,006,582 B2 * 4/2015 Tojo ................. H01L 23/10
174/255

* cited by examiner

PACKAGE, ELECTRONIC DEVICE, METHOD OF MANUFACTURING ELECTRONIC DEVICE, ELECTRONIC APPARATUS, AND MOVING OBJECT

BACKGROUND

1. Technical Field

The present invention relates to a package, an electronic device including the package, an electronic apparatus, a moving object, and a method of manufacturing an electronic device.

2. Related Art

In recent years, in various communication devices, and particularly, in mobile communication devices, there has been a strong demand for reduction in size for an electronic device. As electronic devices used in the mobile communication devices, there are a piezoelectric resonator, a piezoelectric oscillator, a piezoelectric sensor, a SAW filter, and the like.

In the piezoelectric devices whose size reduction is demanded as mentioned above, a configuration in which an element is sealed in a package formed of, for example, ceramics or the like to obtain stable properties have been known. As a specific example, a base member containing ceramics as a main material is used, an electron element is mounted in an opening portion of the base member, and a metal lid is joined by welding and the like so as to form an airtight space having high reliability in the opening portion.

FIGS. 7A and 7B are cross-sectional views showing a schematic configuration of a package structure disclosed in JP-A-2005-142329. FIG. 7A is a cross-sectional view before a lid is joined and FIG. 7B is an enlarged cross-sectional view of a main part after the lid is joined.

As shown in FIG. 7A, the package structure disclosed in JP-A-2005-142329 is configured such that a ceramic base 601 in which a metalized layer 602 is formed in an outer peripheral portion, and a lid 603 which is formed of two layers of a metal plate 603a and a brazing material 603b are airtightly sealed by joining the metalized layer 602 and the brazing material 603b by welding and the like.

In the structure, the lid 603 is formed of two layers of the metal plate 603a and the brazing material 603b as described above and has a bank portion 603C in which a part of the metal plate 603a protrudes toward the brazing material 603b at an outer peripheral end. Then, the brazing material 603b is prevented from being ejected to the outside from an interface portion between the metalized layer 602 and the metal plate 603a by joining the ceramic base 601 and the lid 603 by melting the brazing material 603b in a state in which a surface of the lid 603 on which the brazing material 603b is formed and the metalized layer 602 are in contact, and thus, deterioration in airtightness is prevented.

However, in the package structure disclosed in JP-A-2005-142329, although it is possible to prevent the brazing material 603b from being ejected at the interface portion between the metalized layer 602 and the metal plate 603a, the bank portion 603c is provided in which the outer peripheral portion of the metal plate 603a which forms the lid 603 protrudes toward the brazing material 603b. Thus, the brazing material 603b is not likely to flow out in the outer peripheral portion of the metal plate 603a. Therefore, as shown in FIG. 7B, the brazing material 603b in which the ceramic base 601 and the lid 603 are joined is in a state in which a fillet 604 is not likely to be formed over the metalized layer 602 and the entire outer peripheral portion of the metal plate 603a.

In the package structure disclosed in JP-A-2005-142329, since a joining width (a seal pass 605) in which the metalized layer 602 of the ceramic base 601 and the brazing material 603b of the lid 603 are melted to be joined becomes narrow, there is a problem in that when the brazing material 603b is melted less, airtightness is deteriorated.

Furthermore, in the package structure disclosed in JP-A-2005-142329, since the fillet 604 of the brazing material 603b is not likely to be formed over the entire outer peripheral portion of the metal plate 603a, it is difficult to confirm a sealing state in an external inspection. Thus, there is a concern that the quality of an electronic device may not be maintained since it is very difficult to determine whether or not the sealing state is satisfactory in the package structure disclosed in JP-A-2005-142329.

SUMMARY

An advantage of some aspect of the invention is to solve at least a part of the problems described above, and the invention can be implemented as the following forms or application examples.

Application Example 1

This application example is directed to a package including: a base portion; and a lid which defines an inner space with the base portion and has a metal plate layer and a brazing material layer that is laminated on the metal plate layer, in which the base portion has a metalized layer which is joined with the brazing material layer around the inner space in a plane view, and the brazing material layer has a protrusion which protrudes in a opposite direction of the base portion on an outer peripheral side surface of the metal plate layer.

According to this application example, since the brazing material layer is formed over the entire surface of the lid to be joined with the metalized layer and the brazing material layer has a protruding shape which protrudes in the opposite direction of the base portion on the outer peripheral side surface of the metal plate layer, the brazing material layer is abundantly present in the vicinity of the metalized layer and the outer peripheral side surface of the metal plate layer. Therefore, when the base portion and the lid are joined, the brazing material layer is melted and flows out to both sides of the metalized layer and the outer peripheral side surface of the metal plate layer, and a fillet of the brazing material is formed over the entire peripheries of the metalized layer and the outer peripheral side surface of the metal plate layer. Thus, the base portion and the lid are joined strongly, and a seal pass is elongated by the formation of the fillet, compared to a case in which the fillet is not provided. Accordingly, it is possible to obtain an effect of forming the airtight inner space having high reliability.

In addition, since the fillet of the brazing material is formed over both entire peripheries of the metalized layer and the outer peripheral side surface of the metal plate layer in the package, it is possible to easily determine whether or not the sealing state of the package is satisfactory by an external inspection and a satisfactory quality can be maintained.

Application Example 2

In the package according to Application Example 1, it is preferable that a width of the protrusion of the brazing material layer becomes narrower in a protrusion direction.

According to this application example, since the width of the protrusion of the brazing material layer becomes narrower in the protrusion direction, there is no acute angle on a path from the outer peripheral side surface of the metal plate layer to a surface close to the brazing material layer, and the outer peripheral side surface of the metal plate layer and the surface close to the brazing material layer are smoothly connected, compared to a case in which there are a right angle and an acute angle. Therefore, since the brazing material layer is less likely to be cut on the path from the outer peripheral side surface of the metal plate layer to the surface close to the brazing material layer, the brazing material layer is likely to be formed appropriately and the lid and the metalized layer can be joined more strongly, and thus, the joining strength between the base portion and the lid can be increased.

Application Example 3, Application Example 4

In the package according to Application Example 1 or 2, it is preferable that an interface portion between the protrusion of the brazing material layer and the metal plate layer includes a curved surface which protrudes toward the brazing material layer.

According to these application examples, since the interface portion between the protrusion of the brazing material layer and the metal plate layer includes a curved surface which protrudes toward the brazing material layer, there are no right angle and acute angle on the path from the outer peripheral side surface of the metal plate layer to the surface close to the brazing material layer, and the outer peripheral side surface of the metal plate layer and the surface close to the brazing material layer are smoothly connected, compared to a case in which there are a right angle and an acute angle. Therefore, since the brazing material layer is less likely to be cut on the path from the outer peripheral side surface of the metal plate layer to the surface close to the brazing material layer, the brazing material layer is likely to be formed appropriately and the lid and the metalized layer can be joined more strongly, and thus, the joining strength between the base portion and the lid can be increased.

Application Example 5

This application example is directed to an electronic device including: the package according to Application Example 1; and an electron element which is housed in the inner space of the package.

According to this application example, it is possible to mount the electron element in the inner space of the package which has high joining strength with the lid and whose airtightness is highly reliable. Accordingly, it is possible to obtain an electronic device which is less influenced by moisture and chemical substances from outside and has less deterioration in electric properties of the electron element.

Application Example 6

This application example is directed to an electronic apparatus including: the electronic device according to Application Example 5.

In the electronic apparatus according to the application example, it is possible to increase reliability by using the electronic apparatus in which the electrical properties are less deteriorated by influence from outside.

Application Example 7

This application example is directed a moving object including: the electronic device according to Application Example 5.

In the moving object according to this application example, it is possible to increase reliability by using the electronic device in which the electrical properties are less deteriorated by influence from outside.

Application Example 8

This application example is directed to a method of manufacturing an electronic device using a package including a base portion, and a lid which is placed on the base portion to define an inner space with the base portion and has a metal plate layer and a brazing material layer that is laminated on the metal plate layer, the base portion having a metalized layer which is joined with the brazing material layer around the inner space in a plane view, and the brazing material layer having a protrusion which protrudes in a opposite direction of the base portion on an outer peripheral side surface of the metal plate layer, the method including: mounting an electron element in a region that is the inner space of the base portion and then, joining the base portion and the lid by welding in which the brazing material layer provided around the metalized layer is melted.

In the manufacturing method according to this application example, since the brazing material layer is formed over the entire surface of the lid to be joined with the metalized layer, and the brazing material layer has a protruding shape which protrudes in the opposite direction of the base portion on the outer peripheral side surface of the metal plate layer, the brazing material layer is abundantly present in the vicinity of the metalized layer and the outer peripheral side surface of the metal plate layer. Therefore, when the base portion and the lid are joined, the brazing material layer is melted and flows out to both sides of the metalized layer and the outer peripheral side surface of the metal plate layer, and a fillet of the brazing material is formed over the entire peripheries of the metalized layer and the outer peripheral side surface of the metal plate layer. Thus, the base portion and the lid are joined strongly, and a seal pass is elongated by the formation of the fillet, compared to a case in which the fillet is not provided. Accordingly, it is possible to obtain an effect of forming the airtight inner space having high reliability.

In addition, since the base portion and the lid are joined by welding in which only the brazing material layer provided around the metalized layer is melted, a portion in which the member is heated is limited only to the vicinity to be joined. Therefore, since only the brazing material layer in the portion necessary for joining the base portion and the lid is melted, the brazing material layer, which is present on the lid forming the inner space, is not eluted. Accordingly, it is possible to obtain an effect of preventing the inner space from being contaminated by the elution of the brazing material layer.

Further, since the fillet of the brazing material is formed over the entire peripheries of the metalized layer and the outer peripheral side surface of the metal plate layer in the package, it is possible to easily determine whether or not the sealing state of the package is satisfactory by an external inspection, and a satisfactory quality can be maintained.

Application Example 9

In the method of manufacturing an electronic device according to Application Example 8, it is preferable that the lid which is cut from the brazing material layer is used.

According to this application example, since the brazing material layer is stretched to the outer peripheral side surface of the metal plate layer when the lid is cut, it is possible to form the protruding shape of the brazing material layer which protrudes to an opposite side of the base portion on the outer peripheral side surface of the metal plate layer. Therefore, the same effect as in Application Example 8 can be obtained. Further, since the protruding shape of the brazing material layer can be easily formed without increasing the number of processes of manufacturing the lid, the application example has a great effect in reducing costs.

Application Example 10

This application example is directed to a method of manufacturing a lid including a metal plate layer and a brazing material layer that is laminated on the metal plate layer, the method including: forming the brazing material layer on one surface of the metal plate; and cutting the metal plate from the brazing material layer.

In the method of manufacturing a lid according to this application example, since the brazing material layer is formed on the entire one surface of the lid and when the metal plate is cut, the brazing material layer is stretched to the outer peripheral side surface of the metal plate layer, it is possible to form a protruding shape of the brazing material layer which protrudes toward the metal plate layer on the outer peripheral side surface of the metal plate layer. Accordingly, in the package using the lid according to the application example, a fillet of the brazing material is formed over the entire periphery of the joining portion of the lid and the base portion. Thus, the base portion and the lid are strongly joined and a seal pass is elongated by the formation of the fillet, compared to a case in which the fillet is not provided. Accordingly, in the method of manufacturing a lid according to the application example, it is possible to obtain a package having an effect of forming the airtight inner space having high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of the invention will be described with reference to drawings. Here, in each of the following drawings, the dimensions of each layer or each member may be made different from those in practice in order to make each layer or each member a more recognizable size.

Embodiment

Figure 1:
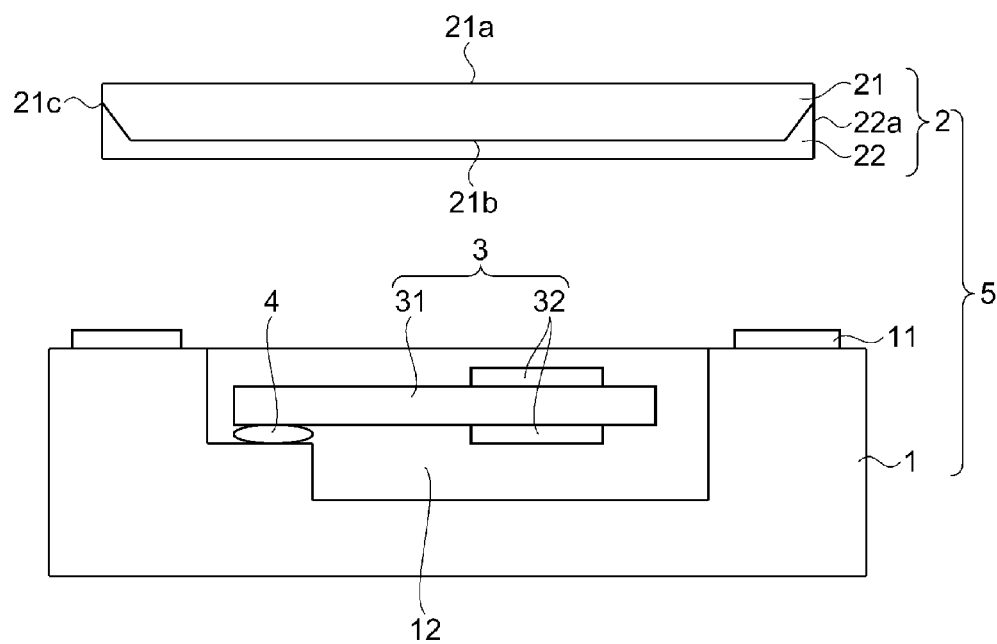
FIG. 1 is a cross-sectional view showing a schematic configuration of a quartz crystal resonator according to an embodiment.

FIG. 1 is a cross-sectional view showing a schematic configuration of a resonator (a quartz crystal resonator) as an example of an electronic device according to an embodiment.

As shown in FIG. 1, the quartz crystal resonator 5 includes a base portion 1, a metalized layer 11, a quartz crystal resonator element 3 as an electron element, a lid 2, and the like.

The base portion 1 is formed of an insulator such as an aluminum oxide sintered body obtained by molding, laminating, and firing a ceramic green sheet, and the like and has a recessed portion 12 inside.

The metalized layer 11 is arranged on the joining surface of the base portion 1 with the lid 2, and the metalized layer 11 is formed of a metal coating film obtained by laminating an underlying metal such as tungsten or molybdenum and laminating a metal such as nickel, or gold on the underlying metal by plating, sputtering, and vapor deposition. Here, it is preferable that a surface layer metal of the metalized layer 11 be gold.

The quartz crystal resonator element 3 includes a quartz crystal substrate 31 as a piezoelectric body, and single gold layer films as a pair of metal electrodes 32 which are formed on front and rear surfaces of the quartz crystal substrate 31. In the embodiment, the metal electrode 32 is formed using a single gold layer film, but a single layer film formed of silver, aluminum or the like other than gold, a two-layered film obtained by providing an intermediate layer formed of chrome, nickel, titanium or the like as a underlying metal on the quartz crystal substrate and then, forming a layer of gold, silver, aluminum or the like on the underlying metal, a multilayer film having three layers or more using plural combinations of the metals, or the like may be used. The metal electrode 32 is formed by plating, sputtering, vapor deposition and the like.

The quartz crystal resonator element 3 is electrically connected and mechanically fixed to the recessed portion 12 by a joining member 4. The quartz crystal resonator element 3 is electrically connected and mechanically fixed to a wiring terminal (not shown) provided in the recessed portion 12 of the base portion 1 using a conductive adhesive as the joining member 4. The quartz crystal resonator element is electrically connected to an external connection terminal (not shown) provided on a rear surface of one principal surface of the base portion of the package by an internal wiring (not shown) and finally connected to an external circuit (not shown). In the embodiment, the quartz crystal resonator element 3 is electrically connected and mechanically fixed to the wiring terminal (not shown) by the conductive adhesive. However, additionally, the electrical connection and mechanical fixation to the wiring terminal may be performed at the same time by metal joining in which a metal bump or the like is used, or the electrical connection may be performed by wire bonding in which the wire is formed of gold, copper, aluminum and the like, and the mechanical fixation may be performed by an adhesive.

The lid 2 is formed of a metal plate layer 21 and a brazing material layer 22.

The metal plate layer 21 is formed of an iron alloy such as kovar and 42 alloy as a main body on an outer surface 21a, a surface 21b close to the brazing material layer, and an outer peripheral side surface 21c. In the embodiment, a single layer plate such as kovar, or 42 alloy is used as the metal plate layer 21. However, the metal plate layer 21 may have a laminated structure or may be a laminated plate in which, for example, the outer surface 21a is formed of kovar and the surface 21b close to the brazing material layer is formed of copper. Further, the metal plate layer may be a layer in which the laminated metals are clad.

The brazing material layer 22 is formed using a silver solder in which silver is used as a main body. The brazing material layer 22 is formed so that the lid 2 has an approximately flat plate shape on the entire surface 21b of the metal plate layer 21 close to the brazing material layer. In the embodiment, the silver solder having sliver as a main component is used as the brazing material layer 22. However, the brazing material layer 22 may be formed using a metal having a lower melting point than that of the metal plate layer 21 or may be formed using metals such as a gold-tin alloy, a lead-free solder, and the like other than silver.

The lid 2 is clad by rolling the metal plate layer 21 and the brazing material layer 22 or the like. In the embodiment, the lid 2 is formed of two layers of the metal plate layer 21 and the brazing material layer 22, but as for the lid 2, an intermediate metal layer which is formed of metal, such as nickel, gold, copper, aluminum, or chromium, having a higher melting point than that of the brazing material layer 22 is formed by plating, sputtering, vapor deposition or the like, and then, the lid 2 may be clad. Further, the above-mentioned metal having a higher melting point than that of the brazing material layer 22 may be formed on the entire surface of the lid 2, may be formed only on the outer surface 21a of the metal plate layer 21 and a surface in which the brazing material layer 22 is exposed, or may be formed only on the outer surface 21a of the metal plate layer 21.

A corner portion formed by the surface 21b close to the brazing material layer and the outer peripheral side surface 21c in the metal plate layer 21 of the lid 2 is chamfered and the brazing material layer 22 has a protrusion 22a that protrudes toward the outer surface 21a which is a surface in a opposite direction of the base portion 1 on the outer peripheral side surface 21c of the metal plate layer 21. At this time, since there are no right angle and acute angle on a path from the surface 21b of the metal plate layer 21 close to the brazing material layer to the outer peripheral side surface 21c, the surface 21b close to the brazing material layer and the outer peripheral side surface 21c are smoothly connected, compared to a case in which there are a right angle and an acute angle on a path from the surface 21b close to the brazing material layer to the outer peripheral side surface 21c. Therefore, as for the metal plate layer 21 and the brazing material layer 22 in the outer peripheral portion of the lid 2, since the brazing material layer 22 is less likely to be cut at the corner portion of the metal plate layer 21, compared to the case in which there are right angle and acute angle, the brazing material layer 22 is likely to be formed appropriately and the lid 2 and the metalized layer 13 can be joined more strongly.

Figure 2:
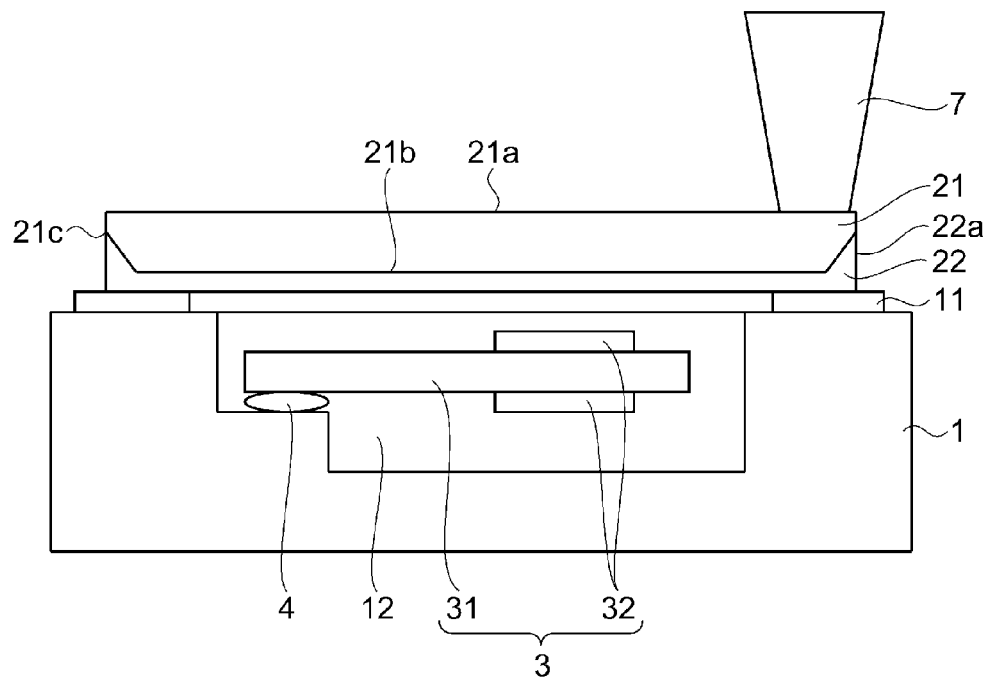
FIG. 2 is an enlarged cross-sectional view showing a state in which a package and a lid are joined in the quartz crystal resonator according to the embodiment.

By placing the base portion 1 in a nitrogen atmosphere which is inert gas, gas in the recessed portion 12 is replaced with the inert gas. Then, as shown in FIG. 2, the lid 2 is placed so that the metalized layer 11 and the brazing material layer 22 face to each other, and irradiation is performed with an electron beam 7 from the outer surface 21a of the metal plate layer 21 to the outer peripheral portion of the base portion 1. The base portion 1 and the lid 2 are joined by making the temperature of the joining portion of the metalized layer 11 and the brazing material layer 22 equal to or higher than the melting point of the brazing material layer 22 and equal to or lower than the melting point of the metal plate layer 21 by the irradiation with the electron beam 7 and melting the brazing material layer 22. Thus, the recessed portion 12 is formed as an airtight inner space.

In the embodiment, nitrogen is used as the inert gas but the inert gas may be other gas such as helium, neon, or argon. Also, the base portion 1 and the lid 2 may be joined after the recessed portion 12 is evacuated instead of using the inert gas.

Since only the brazing material layer 22 in a portion necessary for joining the base portion 1 and the lid 2 is melted by using the electron beam 7, the brazing material layer 22 in the lid 2 in the vicinity of the recessed portion 12 is not eluted. Accordingly, there is no adverse influence of deterioration in electrical properties of the quartz crystal resonator element 3 caused by scattering and attaching the brazing material layer 22 onto the quartz crystal resonator element 3. In the embodiment, the electron beam 7 is used for joining the base portion 1 and the lid 2, but since the joining portion of the metalized layer 11 and the brazing material layer 22 has only to be effectively heated, the same effect can be obtained by a method such as laser or seam welding.

Figure 3:
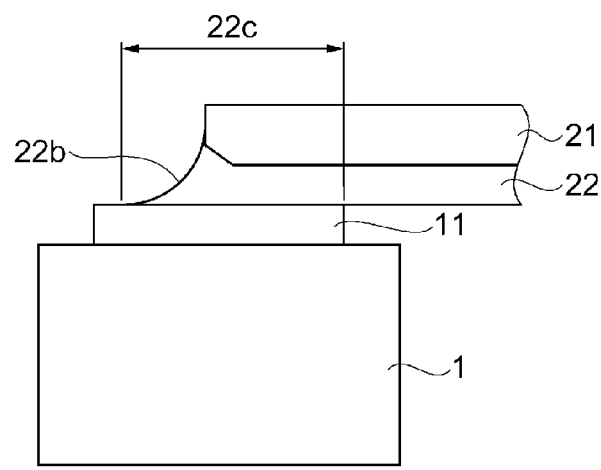
FIG. 3 is an enlarged cross-sectional view showing a schematic configuration of the quartz crystal resonator according to the embodiment in the state in which the package and the lid are joined.

In the above-described lid 2, since the brazing material layer 22 has the protrusion 22a which protrudes toward the outer surface 21a of the metal plate layer 21 on the outer peripheral side surface 21c of the metal plate layer 21, the brazing material layer is abundantly present in the vicinity of the metalized layer 11 and the outer peripheral side surface 21c of the metal plate layer 21. Therefore, as shown in FIG. 3, in a state in which the base portion 1 and the lid 2 are joined after the irradiation with the electron beam 7, the melted brazing material layer 22 flows out to both sides of the metalized layer 11 and the outer peripheral side surface 21c of the metal plate layer 21, and a fillet 22b of the brazing material layer 22 is formed over the entire peripheries of the metalized layer 11 and the metal plate layer 21. Accordingly, the base portion 1 and the lid 2 can be joined strongly and a seal pass 22c can be elongated by the formation of the fillet 22b, compared to a case in which the fillet 22b is not provided. Thus, the recessed portion 12 can be formed as an airtight inner space having high reliability.

In an external inspection which is performed after the quartz crystal resonator 5 is completed, since the fillet 22b of the brazing material layer 22 is formed over the entire peripheries of the metalized layer 11 and the metal plate layer 21, it is possible to easily determine whether or not the shape of the fillet 22b is satisfactory. Accordingly, it is possible to easily determine whether or not the airtightness of the recessed portion 12 of the quartz crystal resonator 5 is satisfactory.

As described above, in the quartz crystal resonator 5 according to the embodiment, it is possible to form the recessed portion 12 as an airtight inner space having high reliability. Therefore, since the quartz crystal resonator element 3 is less influenced by moisture and chemical substances from outside, foreign substances do not adhere to the quartz crystal resonator element 3 and the metal electrode 32 forming the quartz crystal resonator element 3 is not corroded or deteriorated. Thus, since a temporal change in electrical properties of the quartz crystal resonator element 3 is small, it is possible to realize the quartz crystal resonator 5 having a small temporal change in electrical properties.

The invention is not limited to the above-described embodiment and various modifications and improvements can be applied to the above-described embodiment. For example, even when a quartz crystal oscillator is formed by mounting a quartz crystal resonator element and an integrated circuit in an element mounting portion as an electron element, the same effect as in the above-described embodiment can be obtained. In addition, even when a tuning fork type quartz crystal resonator element, a quartz crystal filter element, a gyro sensor element, an SAW element, a semiconductor element and the like are used as the electron element, the same effect as in the above-described embodiment can be obtained.

The invention is not limited to the above-described embodiment and various modifications and improvements can be applied to the above-described embodiment. Modification Examples will be described below.

Modification Example 1

Figure 4:
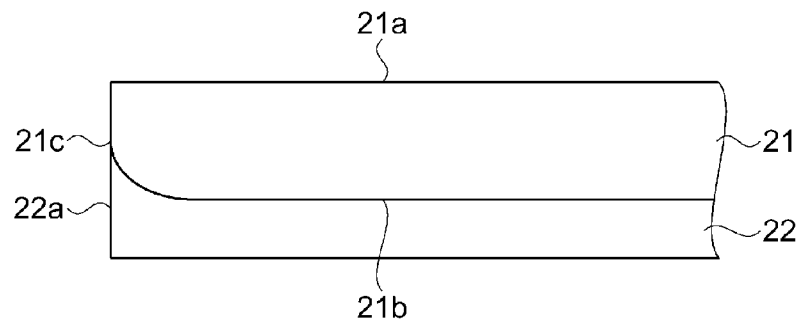
FIG. 4 is an enlarged cross-sectional view showing the vicinity of a side surface of the lid according to Modification Example 1.

FIG. 4 is a cross-sectional view of Modification Example 1 of the lid 2.

Here, the same signs are assigned to the same parts as in the above-described embodiment, and thus the description thereof will be omitted.

As shown in FIG. 4, in the metal plate layer 21 of the lid 2 according to the modification example, the corner portions of the surface 21b of the metal plate layer 21 close to the brazing material layer and the outer peripheral side surface 21c are chamfered in a curved-surface shape and the brazing material layer 22 has the protrusion 22a of the brazing material layer that protrudes toward the outer surface 21a which is a surface in a opposite direction of the base portion 1 on the outer peripheral side surface 21c of the metal plate layer 21. At this time, since there are no right angle and acute angle on the path from the surface 21b of the metal plate layer 21 close to the brazing material layer to the outer peripheral side surface 21c, the surface 21b close to the brazing material layer and the outer peripheral side surface 21c are smoothly connected. Therefore, the metal plate layer 21 and the brazing material layer 22 can be joined more strongly in the outer peripheral portion of the metal plate layer 21, compared to the case in which there are a right angle and an acute angle on the path from the surface 21b close to the brazing material layer to the outer peripheral side surface 21c. The quartz crystal resonator 5 can be formed in such a manner that the lid 2 of the modification example and the base portion 1 of the embodiment are joined by the electron beam 7 or the like to form the recessed portion 12 as an airtight inner space.

As described above, in the quartz crystal resonator 5 according to the modification example, it is possible to obtain the same effect as in the embodiment.

Modification Example 2

Figure 5:
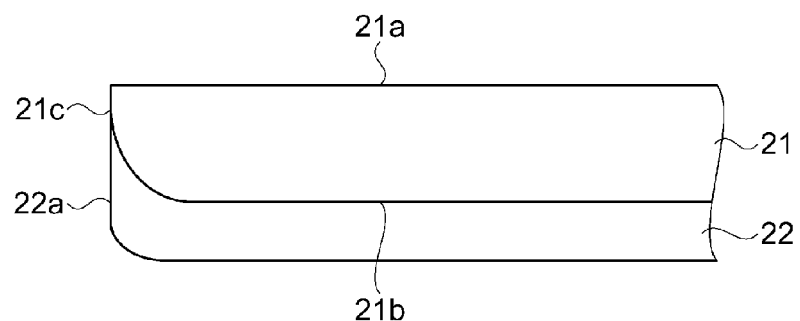
FIG. 5 is an enlarged cross-sectional view showing the vicinity of a side surface of the lid according to Modification Example 2.

FIG. 5 is a cross-sectional view of Modification Example 2 of the lid 2.

Here, the same signs are assigned to the same parts as in the above-described embodiment, and thus the description thereof will be omitted.

The lid 2 of the modification example is formed in such a manner that the brazing material layer 22 is formed on one surface of a metal plate which is larger than the metal plate layer 21, and then, the lid is cut from the brazing material layer through a punching process from the brazing material layer 22. When the lid 2 is formed in such a manner, as shown in FIG. 5, the brazing material layer 22 is stretched to the outer peripheral side surface 21c of the metal plate layer 21 during the punching process, and thus, it is possible to form the protrusion 22a of the brazing material layer 22 which protrudes toward the outer surface 21a, which is a surface in an opposite direction of the base portion 1 on the outer peripheral side surface 21c of the metal plate layer 21. The quartz crystal resonator 5 can be formed in such a manner that the lid 2 of the modification example and the base portion 1 of the embodiment are joined by the electron beam 7 or the like to form the recessed portion 12 as an airtight inner space.

As described above, in the quartz crystal resonator 5 according to the modification example, since the protrusion 22a of the brazing material layer 22 can be easily formed without increasing the number of processes of manufacturing the lid 2, in addition to the effect in the embodiment, the modification example has a great effect in reducing costs.

Modification Example 3

Figure 6:
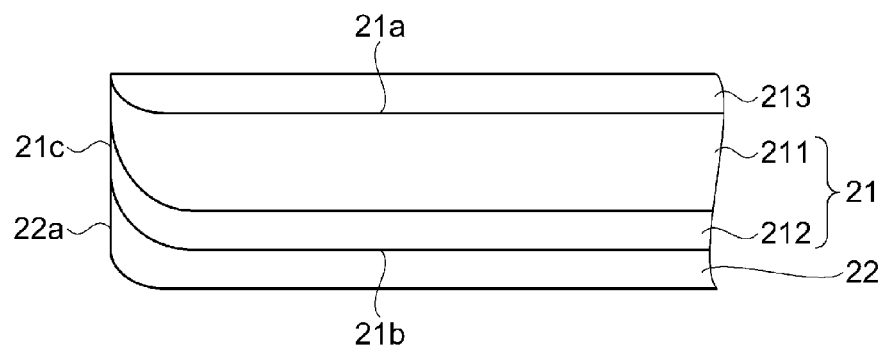
FIG. 6 is an enlarged cross-sectional view showing the vicinity of a side surface of the lid according to Modification Example 3.
Figure 7A:
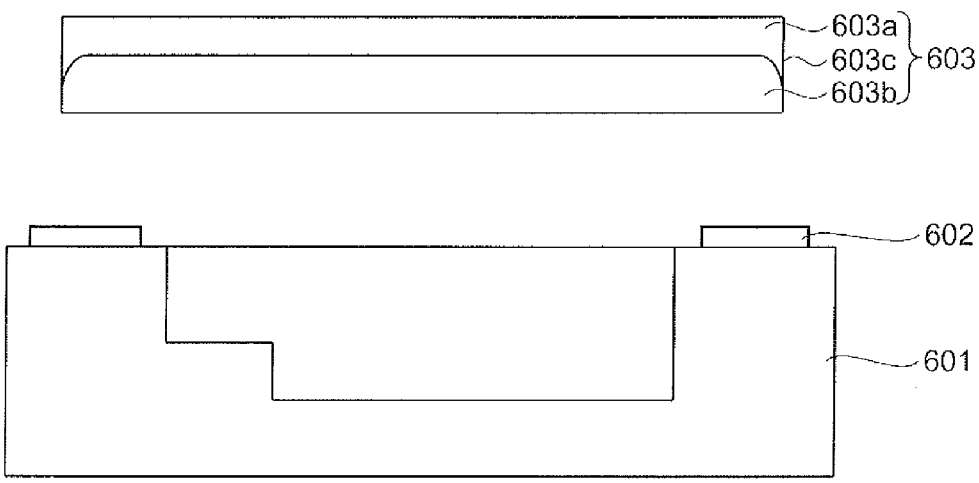
FIG. 7A is a cross-sectional view showing a schematic configuration of an electronic device according to an example of the related art and FIG. 7B is an enlarged cross-sectional view showing a schematic configuration of the electronic device in a state in which a ceramic base and a lid are joined in the example of the related art.
Figure 7B:
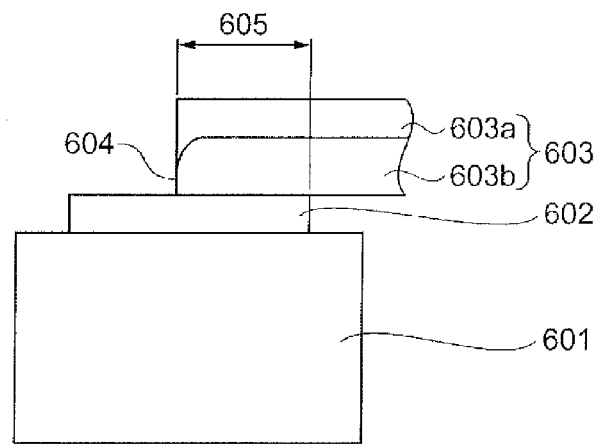

FIG. 6 is a cross-sectional view of Modification Example 3 of the lid 2.

Here, the same signs are assigned to the same parts as in the above-described embodiment, and thus the description thereof will be omitted.

As shown in FIG. 6, the metal plate layer 21 of the lid 2 of the modification example is formed of two metal layers of a first metal plate layer 211 which is kovar and a second metal plate layer 212 which is a metal having copper as a main component, and the outer surface 21a which is a surface in a opposite direction of the base portion 1 is a surface of the first metal plate layer 211 and the surface 21b close to the brazing material layer is a surface of the second metal plate layer 212. Further, a nickel film 213 is formed on the outer surface 21a of the metal plate layer 21. The brazing material layer 22 is formed so that the lid 2 has an approximately flat plate shape on the entire surface 21b close to the brazing material layer. In addition, the nickel film 213, the first metal plate layer 211, the second metal plate layer 212, and the brazing material layer 22 that form the lid 2 are clad.

In the modification example, the same forming method and configuration of the lid 2 shown in Modification Example 2 are used except the above-described configuration, and the quartz crystal resonator 5 can be formed in such a manner that the lid 2 of the modification example and the base portion 1 of the embodiment are joined by the electron beam 7 or the like to form the recessed portion 12 as an airtight inner space.

As described above, in quartz crystal resonator 5 according to the modification example, in addition to the effect in Modification Example 2, since the surface of the lid 2 is coved by nickel having corrosion resistance, it is possible to prevent deterioration in airtightness of the recessed portion 12 caused by corrosion of the lid 2. Further, since the metal plate layer 21 is formed of two layers of the first metal plate layer 211 and the second metal plate layer 212, thermal stress caused by heating when the base portion 1 and the lid 2 are joined can be alleviated and an effect of maintaining strong joining of the base portion 1 and the lid 2 is obtained.

Electronic Apparatus

Figure 8:
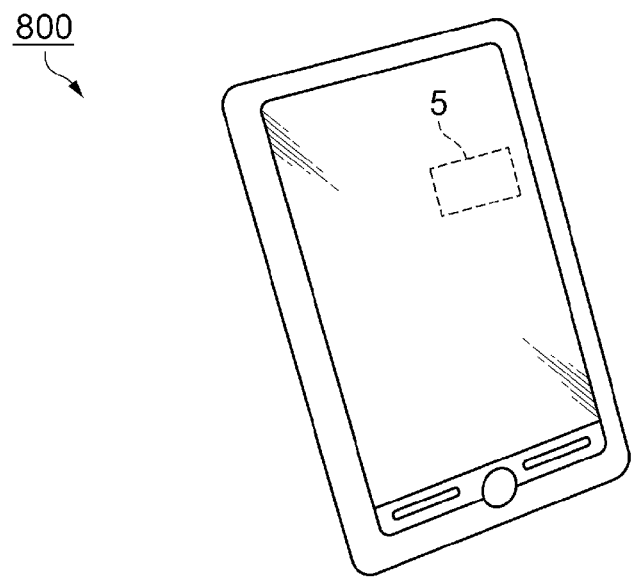
FIG. 8 is a view showing an example of an appearance of an electronic apparatus according to Application Example.

The above-described electronic device can be mounted in various electronic apparatuses. For example, FIG. 8 shows a schematic view of an electronic apparatus (a high-performance portable terminal 800) on which the quartz crystal resonator 5 of the embodiment is mounted. In the high-performance portable terminal 800 as shown in FIG. 8, for example, an angular velocity sensor (not shown) which detects the posture of the high-performance portable terminal 800 is internally equipped and the quartz crystal resonator 5 of the embodiment can be used as a part forming a clock source for operating a control mechanism of the angular velocity sensor. As described above, it is possible to realize the electronic apparatus having high reliability and stable quality by using the quartz crystal resonator 5 of the embodiment.

Various electronic apparatuses may be considered as the electronic apparatus on which the quartz crystal resonator of the example is mounted. For example, there are a personal computer (for example, a mobile personal computer, a laptop personal computer, and a tablet personal computer), a mobile terminal such as a mobile phone, a digital still camera, an inkjet ejection device (for example, an inkjet printer), a storage area network device such as a router or a switch, a local area network device, a television, a video camera, a video recorder, a car navigation system, a pager, a personal digital assistance (with or without communication function), an electronic dictionary, a calculator, an electronic game machine, a game controller, a word processor, a work station, a videophone, a security television monitor, electronic binoculars, a POS terminal, a medical device (for example, an electronic thermometer, a sphygmomanometer, a blood glucose meter, an electrocardiographic measurement system, an ultrasonic diagnostic system, and an electronic endoscope), a fish finder, various measurement instruments, meters (for example, meters for vehicles, airplanes, and ships), a flight simulator, a head-mounted display, motion trace, motion tracking, motion controller, pedestrian dead reckoning (PDR), and the like.

Moving Object

Figure 9:
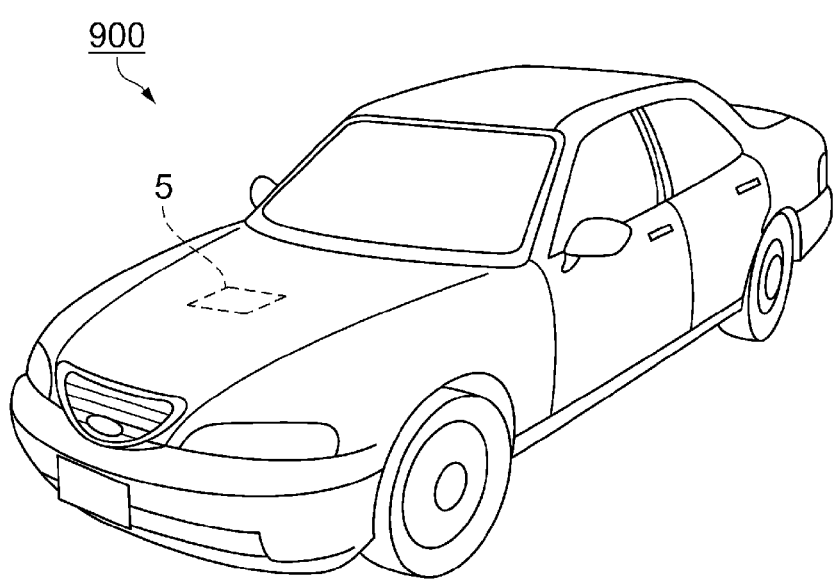
FIG. 9 is a view showing an example of an appearance of a moving object according to an Application Example.

The above-described quartz crystal resonator can be mounted in various moving objects. For example, FIG. 9 shows a schematic view of the moving object (an automobile) on which the quartz crystal resonator 5 of the embodiment is mounted. For example, in the automobile 900 as shown in FIG. 9, the quartz crystal resonator 5 of the embodiment can be used as a part forming a clock source for operating a control circuit (not shown) used for various system control such as engine control and keyless entry system. A described above, it is possible to realize the moving object having high reliability and stable quality by using the quartz crystal resonator 5 of the embodiment.

Various moving objects are considered as the moving object on which the quartz crystal resonator 5 of the example is mounted. For example, there are automobiles (including electric cars), motorcycles, airplanes such as jet planes and helicopters, boats and ships, rockets, satellites, and the like.

The invention includes substantially the same configurations (for example, configurations having the same functions, methods, and results or configurations having the same purposes and advantages) as the configurations explained in the embodiment and the modification examples. Further, the invention includes configurations in which not-essential parts of the configurations explained in the embodiment and the like are replaced. Furthermore, the invention includes configurations that exert the same advantages or achieve the same purposes as those of the configurations explained in the embodiment and the like. In addition, the invention includes configurations in which known technologies are added to the configurations explained in the embodiment and the like.

The entire disclosure of Japanese Patent Application No. 2013-071569, filed Mar. 29, 2013 is expressly incorporated by reference herein.

What is claimed is:

1. A method of manufacturing an electronic device, the method comprising:
    preparing a base of a package for housing an electronic element, the base having a recess;
    preparing a lid of the package, the lid being configured with a metal plate layer and a brazing material layer that is laminated on a metal plate bottom of the metal plate layer, the metal plate bottom facing the base;
    providing a metalized layer at a periphery of the base in a plan view;
    mounting the electronic element in the recess of the base;
    placing the lid on the base to enclose an inner space in which the electronic element is housed; and
    welding the brazing material layer to fix the brazing material to the metalized layer so that the lid and the periphery of the base are fixed to each other,
    wherein the lid is plate shaped having a top, a bottom and side surfaces, and a chamfered part is formed at a lower side edge of the lid between the bottom and side surfaces,
    the brazing material layer is formed on the chamfered part and the bottom surface,
    in a first state, before the lid is fixed to the base by the welding, an outer edge of the brazing material layer and the side surface above the chamfered part form a common surface, and
    in a second state, after the lid is fixed to the base by the welding, the brazing material layer projects outwardly from the common surface.

2. The method of manufacturing an electronic device according to claim 1,
    wherein in the first state, a width of the brazing material layer in a first direction perpendicular to the common surface becomes narrower in a second direction parallel to the common surface from the bottom surface toward the top surface of the lid.

3. The method of manufacturing an electronic device according to claim 1,
    wherein an interface between the brazing material layer and the metal plate layer at the chamfered par of the lid is a curved surface.

* * * * *